(12) United States Patent
Mazumder et al.

(10) Patent No.: US 11,056,171 B1
(45) Date of Patent: Jul. 6, 2021

(54) APPARATUSES AND METHODS FOR WIDE CLOCK FREQUENCY RANGE COMMAND PATHS

(71) Applicant: MICRON TECHNOLOGY, INC., Boise, ID (US)

(72) Inventors: Kallol Mazumder, Dallas, TX (US); Kangjoo Lee, Allen, TX (US); Ming-Bo Liu, Plano, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/737,727

(22) Filed: Jan. 8, 2020

Related U.S. Application Data

(60) Provisional application No. 62/955,237, filed on Dec. 30, 2019.

(51) Int. Cl.
*G11C 11/407* (2006.01)
*G11C 11/409* (2006.01)
*G11C 11/4076* (2006.01)
*G11C 11/4093* (2006.01)

(52) U.S. Cl.
CPC ...... *G11C 11/4076* (2013.01); *G11C 11/4093* (2013.01)

(58) Field of Classification Search
CPC .................. G11C 11/4076; G11C 11/4093
See application file for complete search history.

(56) References Cited

U.S. PATENT DOCUMENTS

| 9,601,170 | B1 | 3/2017 | Mazumder et al. | |
|---|---|---|---|---|
| 10,438,650 | B1* | 10/2019 | Yamashita | G11C 7/1087 |
| 2018/0122440 | A1* | 5/2018 | Manning | H04L 7/0008 |
| 2019/0147927 | A1* | 5/2019 | Jeon | H03L 7/0802 |
| | | | | 365/194 |

\* cited by examiner

*Primary Examiner* — Ajay Ojha
(74) *Attorney, Agent, or Firm* — Dorsey & Whitney LLP

(57) ABSTRACT

Apparatuses and methods for wide clock frequency range command paths are disclosed. An example apparatus includes a command decoder and a command timing circuit. The command decoder is configured to receive a command and is further configured to decode the command to provide a decoded command. The command timing circuit is configured to receive the decoded command responsive to a clock and is further configured to provide a delayed internal command having a delay relative to receiving the decoded command based on clock frequency information indicative of a clock frequency of the clock. The command timing circuit includes a plurality of command timing paths. Each of the plurality of command timing paths is configured to provide a respective delay to the decoded command for a respective range of clock frequencies.

18 Claims, 6 Drawing Sheets

APPARATUSES AND METHODS FOR WIDE CLOCK FREQUENCY RANGE COMMAND PATHS

CROSS-REFERENCE TO RELATED APPLICATION

This application claims the filing benefit of U.S. Provisional Application No. 62/955,237, filed Dec. 30, 2019. This application is incorporated by reference herein in its entirety and for all purposes.

BACKGROUND

In semiconductor memory, proper operation of the memory is based on the correct timing of various internal commands and clocks. For example, in reading data from the memory, internal clocks that clock data path circuitry to provide (e.g. output) the read data may need to be provided substantially concurrently with internal read command signals to properly enable the data path circuitry to output the read data. If the timing of the internal read command signal does not enable the data path circuitry at the time the internal clocks cause the data path circuitry to output the read data at an expected time, the read command may be inadvertently ignored or the read data provided by the memory may not be correct (e.g., the data associated with another read command). The expected time may be related to a latency setting for the memory (e.g., a read latency setting).

Likewise, in writing data to memory internal clocks that clock data path circuitry to latch write data may need to be provided with specific timing relationships with internal write command signals to properly enable the data path circuitry to provide the latched write data for writing to memory. Inaccurate timing of the internal command and clocks could result in the write command being inadvertently ignored or incorrect write data being provided to the memory may (e.g., the write data is associated with another write command). Another example of a command that may require the correct timing of internal clocks and the command for proper operation include, for example, on-die termination enable commands.

Typically, a command path can provide commands having a desired timing for a range of clock frequencies. However, the range of clock frequencies of conventional command paths may be more limited than desirable in light of higher clock frequencies used with faster semiconductor memory. Modifying circuits of a command path may accommodate higher clock frequencies. However, the modifications typically shift the range of acceptable clock frequencies rather than increasing the range, and as a result, may sacrifice operability with clocks of lower clock frequencies.

DETAILED DESCRIPTION

Certain details are set forth herein to provide a sufficient understanding of examples of the disclosure. However, it will be clear to one having skill in the art that examples of the disclosure may be practiced without these particular details. Moreover, the particular examples of the present disclosure described herein should not be construed to limit the scope of the disclosure to these particular examples. In other instances, well-known circuits, control signals, timing protocols, and software operations have not been shown in detail in order to avoid unnecessarily obscuring the disclosure. Additionally, terms such as "couples" and "coupled" mean that two components may be directly or indirectly electrically coupled. Indirectly coupled may imply that two components are coupled through one or more intermediate components.

Various embodiments of the present disclosure will be explained below in detail with reference to the accompanying drawings. The following detailed description refers to the accompanying drawings that show, by way of illustration, specific aspects and embodiments of the disclosure. The detailed description includes sufficient detail to enable those skilled in the art to practice the embodiments of the disclosure. Other embodiments may be utilized, and structural, logical and electrical changes may be made without departing from the scope of the present disclosure. The various embodiments disclosed herein are not necessary mutually exclusive, as some disclosed embodiments can be combined with one or more other disclosed embodiments to form new embodiments.

Figure 1:
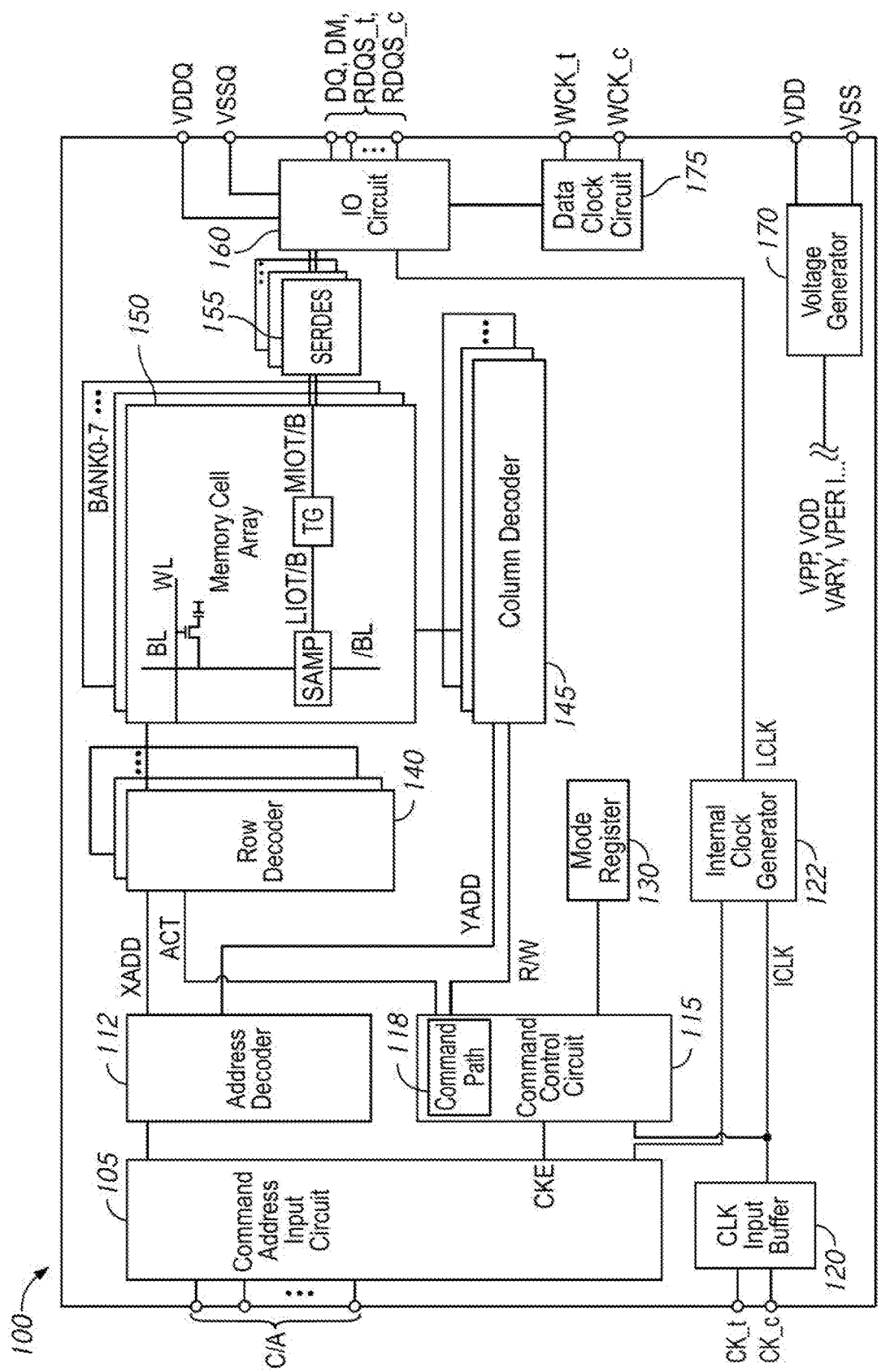
FIG. 1 is a block diagram of an apparatus according to an embodiment of the disclosure.

FIG. 1 is a block diagram of an apparatus according to an embodiment of the disclosure. The apparatus may be a semiconductor device 100, and will be referred to as such. The semiconductor device 100 may include, without limitation, a DRAM device. The semiconductor device 100 may be a low power DDR (LPDDR) memory integrated into a single semiconductor chip in some embodiments of the disclosure.

The semiconductor device 100 includes a memory array 150. The memory array 150 is shown as including a plurality of memory banks. In the embodiment of FIG. 1, the memory array 150 is shown as including eight memory banks BANK0-BANK7. Each memory bank includes a plurality of word lines WL, a plurality of bit lines BL and /BL, and a plurality of memory cells MC arranged at intersections of the plurality of word lines WL and the plurality of bit lines BL and /BL. Selection of the word line WL is performed by a row decoder 140 and selection of the bit lines BL and /BL is performed by a column decoder 145. In the embodiment of FIG. 1, the row decoder 140 includes a respective row decoder for each memory bank and the column decoder 145 includes a respective column decoder for each memory bank. The bit lines BL and /BL are coupled to a respective sense amplifier (SAMP). Read data from the bit line BL or /BL is amplified by the sense amplifier SAMP, and transferred to read/write amplifiers and to serializer/deserializer (SERDES) 155 over complementary local data lines (LIOT/B), transfer gate (TG), and complementary main data lines (MIOT/B). Conversely, write data outputted from the serializer/deserializer 155 and the read/write amplifiers to the sense amplifier SAMP over the complementary main data lines MIOT/B, the transfer gate TG, and the complementary local data lines LIOT/B, and written in the memory cell MC coupled to the bit line BL or /BL.

The SERDES circuitry 155 may support read and write operations by deserializing write data and serializing high speed read data. For example, during a write operation, the SERDES circuitry 155 may be configured to receive serialized write data from the input/output circuit 160 and deserialize the write data (e.g., make it parallel) to provide deserialized write data to memory cell array 150. Additionally, deserialized read data may be received from the memory cell array 150, and the SERDES circuitry 155 may be configured to serialize the read data to provide serialized read data, which may be provided to the input/output circuit 160.

The semiconductor device 100 may employ a plurality of external terminals that include command and address (CA) terminals coupled to a command and address bus to receive commands and addresses. The external terminals may further include clock terminals to receive clocks CK_t and CK_c, and data clocks WCK_t and WCK_c, and to provide access data clocks RDQS_t and RDQS_c, data terminals DQ and DM, and power supply terminals to receive power supply potentials VDD, VSS, VDDQ, and VSSQ.

The clock terminals are supplied with external clocks CK_t and CK_c that are provided to an input buffer 120. The external clocks may be complementary. The input buffer 120 generates an internal clock ICLK based on the CK_t and CK_c clocks. The ICLK clock is provided to a command control circuit 115 and to an internal clock generator 122. The internal clock generator 122 provides various internal clocks LCLK based on the ICLK clock. The LCLK clocks may be used for timing operation of various internal circuits. Data clocks WCK_t and WCK_c are also provided to the external clock terminals. The WCK_t and WCK_c clocks are provided to a data clock circuit 175, which generates internal data clocks based on the WCK_t and WCK_c clocks. The internal data clocks are provided to an input/output circuit 160 to time operation of circuits included in the input/output circuit 160, for example, to output circuits (also input receivers) to time providing read data and/or the receipt of write data.

A mode register 130 may be programmed to store information (e.g., by a mode register write operation) that may be used to set various configurations and/or operation of the semiconductor device 100. For example, the mode register 130 may be programmed with latency information (e.g., read latency, write latency, etc.) that is used to set the timing of data relative to a corresponding memory access command. In some embodiments of the disclosure, the mode register 130 may be programmed with clock frequency information CF, which may be indicative of a clock frequency of a clock, for example, external clocks CK_t and CK_c. The clock frequency information may be used to set configurations based on a clock frequency of the clock. In some embodiments of the disclosure, the information programmed in the register may not expressly identify a clock frequency, but the clock frequency may be inferred from the information programmed in the register. In some embodiments of the disclosure, the mode register 130 includes multi-purpose command (MPC) registers for storing the clock frequency information.

The CA terminals may be supplied with memory addresses. The memory addresses supplied to the CA terminals are transferred, via a command/address input circuit 105, to an address decoder 112. The address decoder 112 receives the address and supplies a decoded row address XADD to the row decoder 140 and supplies a decoded column address YADD to the column decoder 145. The CA terminals may be supplied with commands. Examples of commands include access commands for accessing the memory, such as read commands for performing read operations and write commands for performing write operations, mode register write and read commands for performing mode register write and read operations, as well as other commands and operations.

The commands may be provided as internal command signals to the command control circuit 115 via the command/address input circuit 105. The command control circuit 115 includes circuits to decode the internal command signals to generate various internal signals and commands for performing operations. For example, the command control circuit 115 may provide a row command signal ACT to select a word line and a column command signal R/W to select a bit line. The command control circuit 115 may include a command path 118 that includes a command decoder to decode the internal command signals from the command control circuit 115. The command path 118 may also include circuits for delaying decoded commands to provide an output command having a timing for performing corresponding memory operations. For example, the command decoder may have a delay associated with decoding a command, and circuits of the command path 118 may provide an output command having an overall timing (e.g., including the command decoder delay) for timely performing a memory operation. The output command may be provided, for example, to circuits of the input/output circuit 160 to receive and/or provide data having a desired timing. In some embodiments of the disclosure, the output command provided by the command path 118 may have a timing that satisfies a latency setting (e.g., a latency information programmed in the mode register 130).

When an activate command is issued and a row address is timely supplied with the activate command, and a column address is timely supplied with a read command, read data is read from memory cells in the memory array 150 corresponding to the row address and column address. The read command is received by the command control circuit 115, which provides internal commands so that read data from the memory array 150 is provided to the read/write amplifiers and the serializer/deserializer 155. The read data is output to outside from the data terminals DQ via the input/output circuit 160. The RDQS_t and RDQS_c clocks are provided externally from clock terminals for timing provision of the read data by the input/output circuit 160. The external terminals DQ include several separate terminals, each providing a bit of data synchronized with a clock edge of the RDQS_t and RDQS_c clocks.

When the activate command is issued and a row address are timely supplied with the activate command, and a column address is timely supplied with a write command, write data supplied to the DQ pads together with the data strobe signal is written to a memory cells in the memory array 150 corresponding to the row address and column address. A data mask may be provided to the data terminals DM to mask portions of the data when written to memory. The write command is received by the command control circuit 115, which provides internal commands so that the write data is received by input receivers in the input/output circuit 160. WCK_t and WCK_c clocks are also provided to the external clock terminals for timing the receipt of the write data by the input receivers of the input/output circuit 160. The write data is supplied via the input/output circuit 160 to the serializer/deserializer 155, and by the read/write amplifiers to the memory array 150 to be written into the memory cell MC. As previously described, the external terminals DQ include several separate terminals. With reference to a write operation, each external terminal DQ concurrently receives a bit of data synchronized with a clock edge of the WCK_t and WCK_c clocks.

The power supply terminals are supplied with power supply potentials VDD and VSS. The power supply potentials VDD and VSS are supplied to an internal voltage generator circuit 170. The internal voltage generator circuit 170 generates various internal potentials VPP, VOD, VARY, VPERI, and the like based on the power supply potentials VDD and VSS supplied to the power supply terminals. The internal potential VPP is mainly used in the row decoder 140, the internal potentials VOD and VARY are mainly used in the sense amplifiers SAMP included in the memory array 150, and the internal potential VPERI is used in many peripheral circuit blocks.

The power supply terminals are also supplied with power supply potentials VDDQ and VSSQ. The power supply potentials VDDQ and VSSQ are supplied to the input/output circuit 160. The power supply potentials VDDQ and VSSQ supplied to the power supply terminals may be the same potentials as the power supply potentials VDD and VSS supplied to the power supply terminals in an embodiment of the disclosure. The power supply potentials VDDQ and VSSQ supplied to the power supply terminals may be different potentials from the power supply potentials VDD and VSS supplied to the power supply terminals in another embodiment of the disclosure. The power supply potentials VDDQ and VSSQ supplied to the power supply terminals are used for the input/output circuit 160 so that power supply noise generated by the input/output circuit 160 does not propagate to the other circuit blocks.

Figure 2:
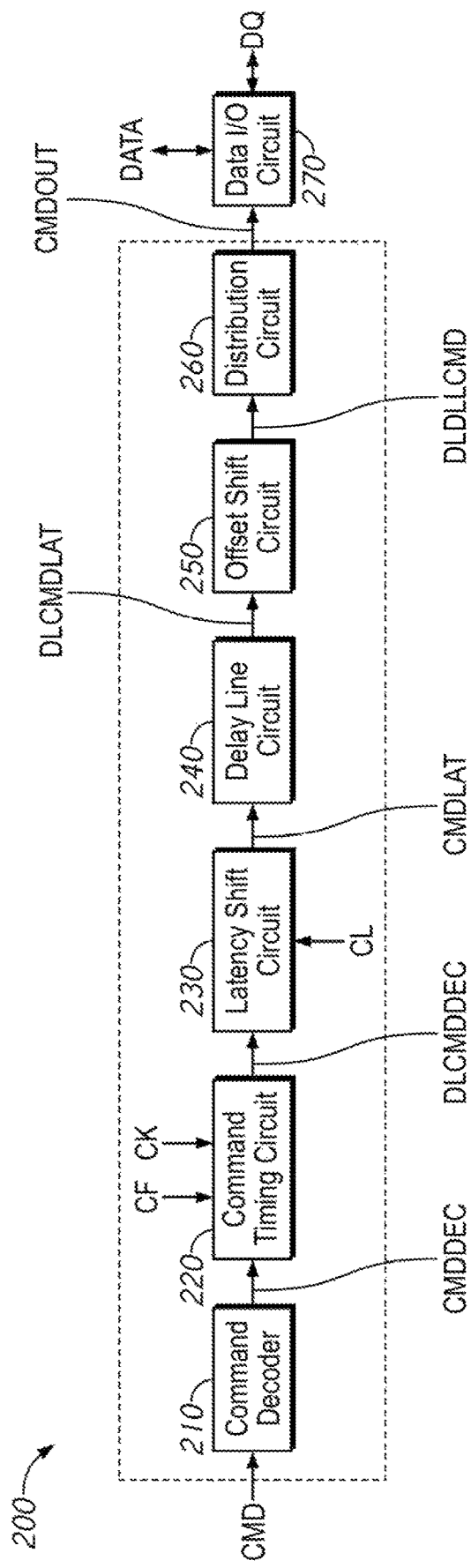
FIG. 2 is a block diagram of a command path according to an embodiment of the disclosure.

FIG. 2 is a block diagram of a command path 200 according to an embodiment of the disclosure. The command path 200 may be included in the command path 118 of FIG. 1 in some embodiments of the disclosure.

The command path 200 includes a command decoder 210 that receives commands CMD, for example, from a command and address input circuit (e.g., command and address input circuit 105 of FIG. 1). The command decoder 210 decodes the commands and provides a decoded command CMDDEC for a memory operation. For example, a read command may be received by the command decoder 210 and provide a decoded read command for a memory read operation.

The decoded commands are provided by the command decoder 210 to a command timing circuit 220. The command timing circuit 220 provides delayed internal commands DLCMDDEC having a timing based on clock frequency information CF. The clock frequency information may be indicative of a clock frequency of a clock, for example, CK_t and CK_c. In some embodiments of the disclosure, the clock frequency information CF is based on information programmed in a register, for example, a mode register (e.g., mode register 130 of FIG. 1). In some embodiments of the disclosure, the information programmed in the register may not expressly identify a clock frequency, but the clock frequency may be inferred from the information programmed in the register.

In some embodiments of the disclosure, n tCK of the clock CK (where tCK is one clock cycle of the clock CK) may be provided to the command timing circuit 220 following receipt of a command, and the command timing circuit 220 provides the delayed internal command DLCMDDEC at a time less than n tCK.

The delayed internal commands DLCMDDEC are provided by the command timing circuit 220 to latency shift circuit 230. The latency shift circuit 230 delays the delayed internal command DLCMDDEC by a number of clock cycles tCK and provides a latency delayed command CMDLAT to a delay line circuit 240. The number of clock cycles tCK the latency shift circuit 230 delays the DLCMDDEC command may be based on latency information CL, for example, read latency and/or write latency information. In some embodiments of the disclosure, the latency information CL may be programmed in a mode register (e.g., mode register 130 of FIG. 1).

The delay line circuit 240 delays the latency delayed command CMDLAT to provide a delayed command DLCMDLAT. In some embodiments of the disclosure, the delay provided by the delay line circuit 240 may model a delay of a similar delay line circuit in a signal path. For example, the delay line circuit 240 may provide a delay that models a delay of a delay line circuit included in a data signal path through which data related to an access command propagates.

The delay line circuit 240 provides a delayed command DLLCMD to an offset shift circuit 250. The offset shift circuit 250 delays the DLLCMD command to provide a delayed command DLDLLCMD having a timing offset. For example, the timing offset may be for a command preamble that indicates an impending command. In another example, the timing offset may be additionally or alternatively for setting a timing to the command to provide a data signal offset for providing data related to an access command.

The offset shift circuit 250 provides the delayed command DLDLLCMD to a command distribution circuit 260 (e.g., a command tree circuit). The command distribution circuit 260 distributes the delayed command DLDLLCMD as a command CMDOUT to various circuits. For example, in some embodiments of the disclosure, the command distribution circuit 260 provides the CMDOUT command to data input/output circuits 270. The CMDOUT command may enable the data input/output circuits 270 to provide data DATA as data DQ and/or receive data DQ, where data DQ is related to an access command. In some embodiments of the disclosure, the data input/output circuit 220 is included in an input/output circuit (e.g., input/output circuit 160 of FIG. 1).

The command path 200 adds delay to a command as it propagates through the path to be provided as the command CMDOUT having a desired timing. For example, the timing of the CMDOUT command relative to when a command is received may enable the data input/output circuits 270 to provide and/or receive data DQ with a timing that satisfies a latency setting.

In some embodiments of the disclosure, one or more of the circuits shown as included in the command path 200 of FIG. 2 may be omitted. For example, in some embodiments of the disclosure, the command path 200 may not include the latency shift circuit 230, delay line circuit 240, offset shift circuit 250, and/or distribution circuit 260.

Figure 3:
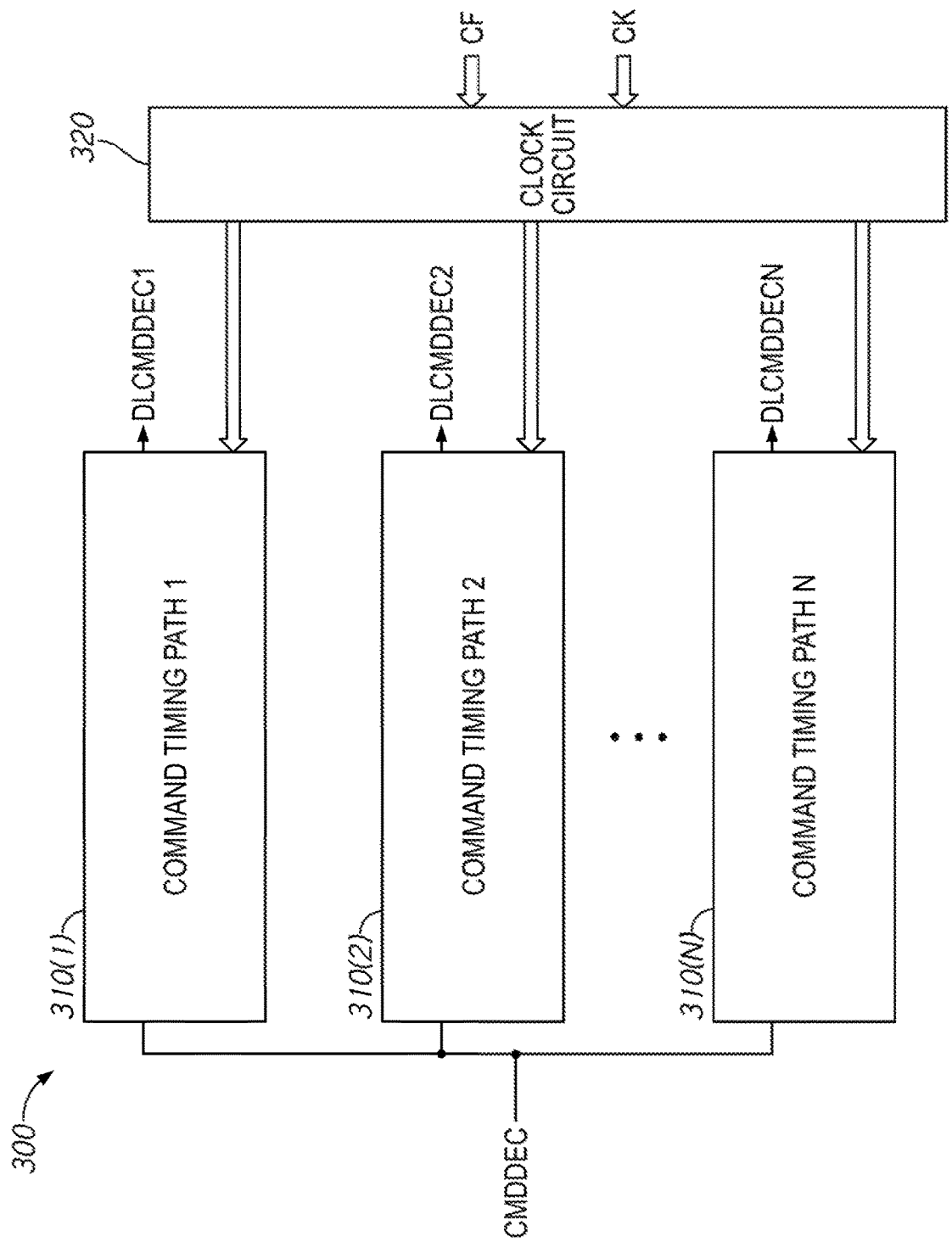
FIG. 3 is a block diagram of a command timing circuit according to an embodiment of the disclosure.

FIG. 3 is a block diagram of a command timing circuit 300 according to an embodiment of the disclosure. The command timing circuit 300 may be included in the command path 200 of FIG. 2 and/or the command path 118 of FIG. 1 in some embodiments of the disclosure.

The command timing circuit 300 includes command timing paths 310(1)-310(N), where N is an integer. The command timing paths 310 are provided a decoded command CMDDEC, for example, from a command decoder (e.g., command decoder 210 of FIG. 2). A clock circuit 320 receives a clock CK and provides the clock to one of the command timing paths 310 based on clock frequency information CF. For example, for a first clock frequency (e.g., indicated by the frequency information CF), the CK clock is provided to a first one of the command timing path and for a second (different) clock frequency, the CK clock is provided to a second one of the command timing paths. The clock frequency information may be indicative of a clock frequency of the clock CK. In some embodiments, the CK clock may be a system clock, or a clock based on a system clock, for example, CK_t and/or CK_c. A command timing path 310 adds delay to the CMDDEC command when provided an active CK clock to provide a delayed internal command DLCMDDEC. A clock is active when it periodically changes between high and low clock levels. The command timing paths 310 that are not provided the active CK clock by the clock circuit 310 do not delay the CMDDEC command and do not provide a delayed internal command DLCMDDEC.

The clock frequency information CF may be based on information programmed in a register, for example, a mode register (e.g., mode register 130 of FIG. 1). As previously described, in some embodiments of the disclosure, the information programmed in the register may not expressly identify a clock frequency, but the clock frequency may be inferred from the information programmed in the register.

Each of the command timing paths 310 delays the CMDDEC command to provide a DLCMDDEC command based on a respective number of clock cycles tCK of the clock CK for a range of clock frequencies. For example, for a first clock frequency, a first command timing path 310 may delay the CMDDEC command to provide the DLCMDDEC command a first number of clock cycles tCK after receiving the CMDDEC command, and for a second clock frequency, a second command timing path 310 may delay the CMDDEC command to provide the DLCMDDEC command a second number of clock cycles tCK after receiving the CMDDEC command. In some embodiments of the disclosure, the respective delay (and number of clock cycles to provide the respective delay) of each command timing path 310 may be better suited for a respective range of clock frequencies of the clock CK. For example, a command timing path 310 may be designed to provide a desired delay using a number of clock cycles tCK of the clock CK for a range of clock frequencies of the clock CK. Another command timing path 310 may be designed to provide a desired delay using a different number of clock cycles tCK of the clock CK for a different range of clock frequencies.

By including multiple command timing paths 310, each tailored for a respective range of clock frequencies, the clock timing circuit 300 may accommodate a wide range of clock frequencies to provide desired delays to the CMDDEC command in providing the DLCMDDEC command. As previously described, the delays provided by the command timing paths 310 of the command timing circuit 300 may be included in an overall command path delay, which may be controlled to provide a CMDOUT command having a timing to satisfy a latency condition. Thus, the command timing circuit 300 may be used to provide an overall command path delay to meet latency conditions for a wide range of clock frequencies.

In some embodiments of the disclosure, while the delay time provided by each of the command timing paths 310 may be relatively similar, the number of clock cycles tCK for providing the respective delay time may be different. For example, a command timing path for a range of relatively higher clock frequencies of the CK clock will use a higher number of clock cycles tCK to provide a respective delay than a command timing path for a range of relatively lower clock frequencies of the CK clock.

In some embodiments of the disclosure, the delay provided by a command timing path 310 may be related to a command decoder delay. For example, for a command timing path 310 that uses M clock cycles tCK to provide a respective delay to the CMDDEC command, the respective delay may be [(M×tCK)−DEC_DELAY], where DEC_DELAY may be similar to the command decoder delay. As a result, a command decoder delay (e.g., similar to the delay DEC_DELAY) may be accommodated by the delay provided by the command timing path 310.

In some embodiments of the disclosure, the command timing paths 310 include a respective command timing shift circuit. The command timing shift circuit provides a delay by shifting a CMDDEC through a series of circuits to provide the delayed internal command DLCMDDEC. The circuits may be, for example, clocked flip-flop circuits that are clocked by the CK clock and/or delayed clocks based on the CL clock.

Figure 4:
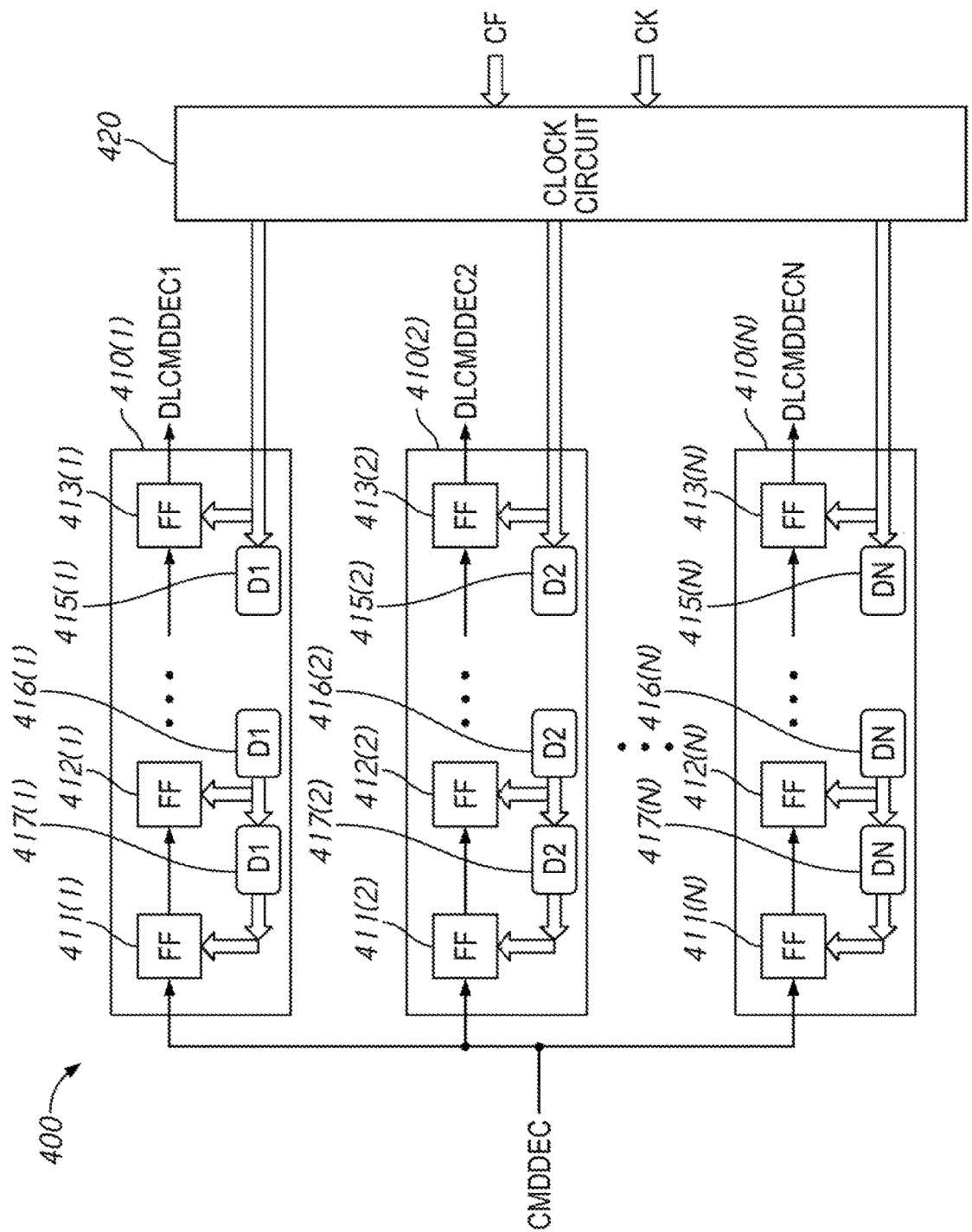
FIG. 4 is a block diagram of a command timing circuit according to an embodiment of the disclosure.

FIG. 4 is a block diagram of a command timing circuit 400 according to an embodiment of the disclosure. The command timing circuit 400 may be included in the command timing path 200 of FIG. 2 and/or the command path 18 of FIG. 1 in some embodiments of the disclosure.

The command timing circuit 400 includes command timing paths 410(1)-410(N), where N is an integer. The command timing paths 410 are provided a decoded command CMDDEC, for example, from a command decoder (e.g., command decoder 210 of FIG. 2). A clock circuit 420 receives a clock CK and provides the clock to one of the command timing paths 410 based on clock frequency information CF. For example, for a first clock frequency (e.g., indicated by the frequency information CF), the CK clock is provided to a first one of the command timing path and for a second (different) clock frequency, the CK clock is provided to a second one of the command timing paths. The clock frequency information may be indicative of a clock frequency of the clock CK. In some embodiments, the CK clock may be a system clock, or a clock based on a system clock, for example, CK_t and/or CK_c. A command timing path 410 adds delay to the CMDDEC command when provided an active CK clock to provide a delayed internal command DLCMDDEC. The command timing paths 410 that are not provided the active CK clock by the clock circuit 410 do not delay the CMDDEC command and do not provide a delayed internal command DLCMDDEC.

The command timing circuit 400 is similar to the command timing circuit 300 previously described with reference to FIG. 3. As such, the description of the command timing paths 310 and clock circuit 320 for the command timing circuit 300 is generally applicable to the command timing paths 410 and clock circuit 420. However, the command timing paths 410 include respective command timing shift circuits. The command timing shift circuits of a command timing path 410 includes series coupled clocked flip-flop circuits 411-413 and series coupled delay circuits 415-417. The clocked flip-flop circuit 411 represents a first clocked flip-flop circuit and the clocked flip-flop circuit 413 represents a last clocked flip-flop circuit in the series, with one or more clocked flip-flop circuits in between (represented by clocked flip-flop circuit 412). Similarly, the delay circuit 415 represents a first delay circuit and delay circuit 417 represents a last delay circuit in the series, with one or more delay circuits in between (represented by delay circuit 416). In some embodiments of the disclosure, the number of delay circuits included in a command shift circuit is one less than the number of clocked flip-flop circuits.

The number of clocked flip-flop circuits included in each of the command shift circuits may be different. Additionally or alternatively, the number of delay circuits included in each of the command shift circuits may be different. For example, each of the command timing shift circuits may include a respective number of clocked flip-flop circuits 411-413 and delay circuits 415-417 to provide a delay to the CMDDEC command for a respective range of clock frequencies of the system clock. A command timing shift circuit that provides a delay to the CMDDEC command for a range of relatively high clock frequencies may include a greater number of clocked flip-flops and delay circuits compared to a command timing shift circuit that provides a delay to the CMDDEC command for a range of lower clock frequencies.

In operation, a command timing path 410 delays the CMDDEC command by propagating the command through the series coupled clocked flip-flop circuits 411-413 when provided an active CK clock. The clocked flip-flop circuits 411-413 are clocked by differing delayed clocks based on the CK clock. Generally, the first clocked flip-flop circuit 411 in the series is clocked with the greatest delayed clock (e.g., provided by the delay circuit 417) and the last clocked flip-flop 413 in the series is clocked with the least delayed clock (e.g., the CK clock with no delay). As a result, the command timing path 410 uses a number of clock cycles tCK of the CK clock to provide a delay to the CMDDEC command (to provide the DLCMDDEC command) that is less than the sum of the clock periods for the number of clock cycles tCK. For example, a timing command path 410 that uses C number of clock cycles tCK provides a delay to the CMDDEC command that is less than C×T, where T is the period of one clock cycle tCK.

Figure 5:
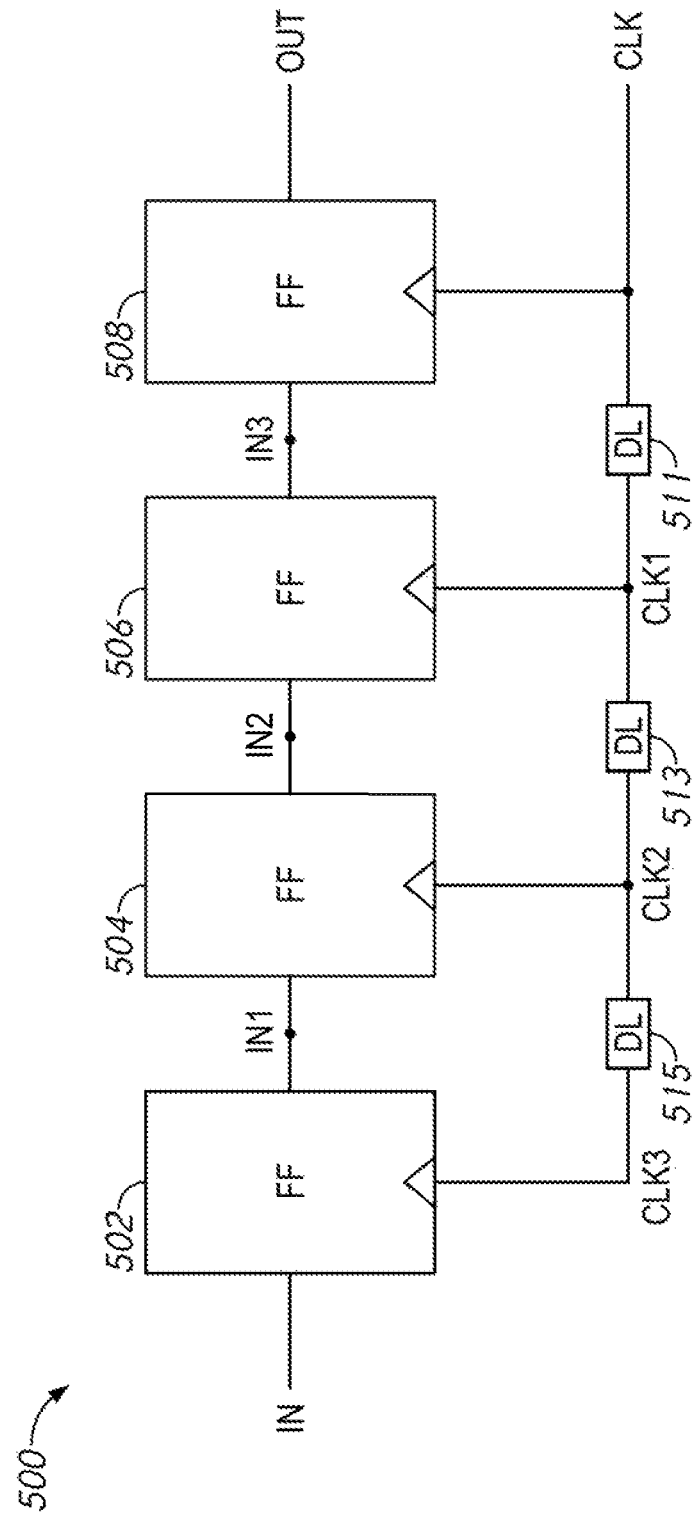
FIG. 5 is a block diagram of a command timing shift circuit according to an embodiment of the disclosure.

FIG. 5 is a block diagram of a command timing shift circuit 500 according to an embodiment of the disclosure. The command timing shift circuit 500 is provided by way of example to describe operation of a timing shift circuit included in a command timing path (e.g., a timing shift circuit included in command timing paths 300 and/or 400 of FIGS. 3 and 4).

The command timing shift circuit 500 includes series coupled clocked flip-flop circuits 502-508, and series coupled delay circuits 511-515. An input signal IN (e.g., input command) is propagated through the clocked flip-flop circuits 502-508 to provide an output signal OUT (e.g., delayed command) having a delay relative to the input. Each of the clocked flip-flop circuits 502-508 is clocked by a respective clock that has a different delay relative to an input clock CLK. The different delays are provided by the series coupled delay circuits 511-515, each providing a delay DL. For example, the clocked flip flop circuit 502 is clocked by the clock CLK3 that is the most delayed clock relative to the CLK clock (e.g., 3 DL delay); the clocked flip-flop circuit 504 is clocked by the clock CLK2 that is the second most delayed clock relative to the CLK clock (e.g., 2 DL delay); the clocked flip-flop circuit 506 is clocked by the clock CLK1 that is the third most delayed clock relative to the CLK clock (e.g., 1 DL delay); and the clocked flip-flop circuit 508 is clocked by the clock CLK (having no delay).

Figure 6:
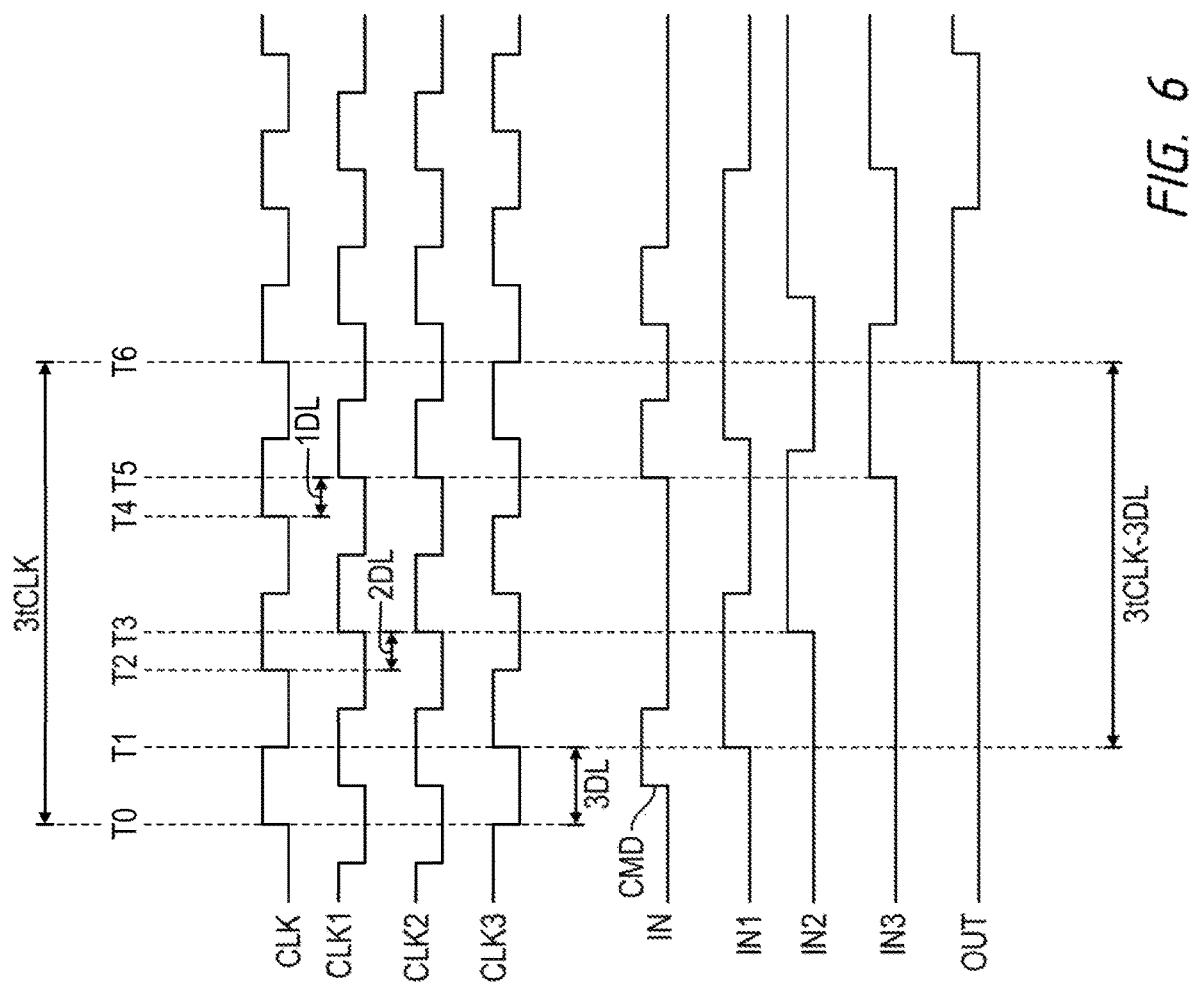
FIG. 6 is a timing diagram of various signals and clocks during operation of the command timing shift circuit of FIG. 5 according to an embodiment of the disclosure.

Operation of the command timing shift circuit 500 will be described with reference FIG. 6. FIG. 6 is a timing diagram of various signals and clocks during operation of the command timing shift circuit 500 according to an embodiment of the disclosure. FIG. 6 illustrates clocks CLK, CLK1, CLK2, and CLK3, and further illustrates the input signal IN, propagating signals IN1, IN2, and IN3, and the output signal OUT. As shown, the CLK1 clock is delayed by a delay of 1DL relative to the CLK clock; the CLK2 clock is delayed by a delay of 2DL relative to the CLK clock; and the CLK3 clock is delayed by a delay of 3DL relative to the CLK clock. In some embodiments of the disclosure, the input signal IN may be a command (e.g., decoded command CMDDEC) and the output signal OUT may be a delayed decoded command (e.g., delayed decoded command DLCMDDEC). The clock CLK may be a clock CK, as previously described, in some embodiments of the disclosure.

A rising clock edge of the CLK clock at time T0 results in a rising clock edge of the CLK3 clock at time T1, that is, after a delay of 3DL. The delay of 3DL is provided to the CLK clock by the delay circuits 511-515 to provide the CLK3 clock. The rising edge of the CLK3 clock at time T1 clocks the flip-flop circuit 502 to receive the IN signal (e.g., a command CMD) and provide the IN1 signal. At time T1, the IN signal is a high logic level, resulting in the IN1 signal provided by the flip-flop circuit 502 changing to a high logic level. A following rising edge of the CLK clock at time T2 results in a rising clock edge of the CLK2 clock at time T3, that is, after a delay 2DL. The delay of 2DL is provided to the CLK clock by the delay circuits 511-513 to provide the CLK2 clock. The rising edge of the CLK2 clock at time T3 clocks the flip-flop circuit 504 to receive the IN1 signal and provide the IN2 signal. At time T3, the IN1 signal is a high logic level, resulting in the IN2 signal provided by the flip-flop circuit 504 changing to a high logic level. A following rising edge of the CLK clock at time T4 results in a rising clock edge of the CLK1 clock at time T5, that is, after a delay of 1DL. The delay of 1DL is provided to the CLK clock by the delay circuit 511 to provide the CLK1 clock. The rising edge of the CLK1 clock at time T5 clocks the flip-flop circuit 506 to receive the IN2 signal and provide the IN3 signal. At time T5, the IN2 signal is a high logic level, resulting in the IN3 signal provided by the flip-flop circuit 506 changing to a high logic level. Finally, a following rising edge of the CLK clock at time T6 clocks the flip-flop circuit 508 to receive the IN3 signal and provide the OUT signal. At time T6, the IN3 signal is a high logic level, resulting in the OUT signal provided by the flip-flop circuit 508 changing to a high logic level.

As shown by the example of FIG. 6, for the command timing shift circuit 500, the IN signal is propagated through the series coupled flip-flop circuits 502-508, as each of the flip-flop circuit is clocked by a respective clock, each clock delayed a different amount relative to the CLK clock. The most delayed clock (e.g., CLK3) clocks a first flip-flop circuit (e.g., flip-flop circuit 502) and a least delayed clock (e.g., CLK) clocks a last flip-flop circuit (e.g., flip-flop circuit 508). Delay is added to the N signal is propagated through the flip-flop circuits 502-508. For example, three clock cycles tCLK of the clock CLK (e.g., between times T0-T6) are used to provide a delay to the IN signal of 3 tCLK−3 DL in providing the OUT signal.

From the foregoing it will be appreciated that, although specific embodiments of the disclosure have been described herein for purposes of illustration, various modifications may be made without deviating from the spirit and scope of the disclosure. Accordingly, the scope of the disclosure should not be limited any of the specific embodiments described herein.

What is claimed is:

1. An apparatus, comprising:
   a command decoder configured to receive a command and further configured to decode the command to provide a decoded command; and
   a command timing circuit configured to receive the decoded command responsive to a clock and further configured to provide a delayed internal command having a delay relative to receiving the decoded command based on clock frequency information indicative of a clock frequency of the clock, the command timing circuit including:
   a plurality of command timing paths, each configured to receive the decoded command and provide a respective delay to the decoded command for a respective range of clock frequencies.

2. The apparatus of claim 1 wherein the command timing circuit further includes a clock circuit configured to receive the clock and provide the clock to a command timing path of the plurality of timing paths.

3. The apparatus of claim 1 wherein a command timing path of the plurality of command timing paths comprises:
   a plurality of series coupled delay circuits configured to receive the clock and provide a series of delayed clocks; and
   a plurality of series coupled clocked flip-flop circuits configured to propagate the decoded command therethrough responsive to the series of delayed clocks to provide the delayed internal command,
   wherein a first of the plurality of series coupled clocked flip-flop circuits is configured to receive the decoded command and a last of the plurality of series coupled clocked flip-flop circuits is configured to provide the delayed internal command, and
   wherein a most delayed clock is provided to the first of the plurality of series coupled clocked flip-flop circuits and a least delayed clock is provided to the last of the plurality of series coupled clocked flip-flop circuits.

4. The apparatus of claim 3 wherein the command timing path of the plurality of command timing paths includes one less delay circuit than clocked flip-flop circuits.

5. An apparatus, comprising:
   a command decoder configured to receive a command and further configured to decode the command to provide a decoded command; and
   a command timing circuit configured to receive the decoded command responsive to a clock and further configured to provide a delayed internal command having a delay relative to receiving the decoded command based on clock frequency information indicative of a clock frequency of the clock, the command timing circuit including:
   a plurality of command timing paths, each configured to provide a respective delay to the decoded command for a respective range of clock frequencies, wherein a first of the plurality of command timing paths includes a first number of clocked flip-flop circuits and wherein a second of the plurality of command timing paths includes a second number of clocked flip-flop circuits, the second number different than the first number.

6. The apparatus of claim 1 wherein a first of the plurality of command timing paths provides a respective delay using a first number of clock cycles of the clock for a first range of clock frequencies and wherein a second of the plurality of command timing paths provides a respective delay using a second number of clock cycles of the clock for a second range of clock frequencies.

7. The apparatus of claim 6 wherein the first of the plurality of command timing paths provides a delay less than a time for the first number of clock cycles.

8. An apparatus, comprising:
   a data input/output circuit configured to provide output data or receive input data responsive to being enabled by the output command from the command path; and
   a command path configured to receive a command, and responsive to a clock provide an output command to the data input/output circuit having a delay relative to receiving the command to meet a latency setting,
   wherein the command path includes a command timing circuit configured to receive the clock and to provide a first delay to the command using a first number of clock cycles of the clock having a clock frequency within a first range of clock frequencies and provide a second delay to the command using a second number of clock cycles of the clock having clock frequency within a second range clock frequencies, the second number of clock cycles different from the first number of clock cycles, wherein the command timing circuit comprises:
   a plurality of command timing paths, each configured to receive the command and provide a respective delay to the command for a respective range of clock frequencies; and
   a clock circuit configured to receive the clock and provide one of the plurality of command timing paths the clock based on a clock frequency of the clock.

9. The apparatus of claim 8, further comprising a mode register configured to store clock frequency information indicative of the clock frequency of the clock.

10. The apparatus of claim 8 wherein the data input/output circuit is configured to receive read data and provide output data responsive to the output command from the command path.

11. The apparatus of claim 8 wherein the command path further includes a command decoder configured to receive an internal command and decode the internal command to provide a decoded internal command, the first delay related to a command decoder delay of the command decoder.

12. Apparatus of claim 11 wherein the second delay is also related to the command decoder delay of the command decoder.

13. The apparatus of claim 8 wherein the command path further includes:
   a command decoder configured to receive the command and decode the command to provide a decoded command to the command timing circuit;
   a latency shift circuit configured to receive a delayed command from the command timing circuit and delay the delayed command by a number of clock cycles of the clock to provide a latency delayed command, the number of clock cycles based on latency information;
   a delay line circuit configured to delay configured to delay the latency delayed command to provide a delayed command;
   an offset shift circuit configured to receive the delayed command and provide a command having a timing offset; and
   a command distribution circuit configured to distribute the command with the timing offset to the data input/output circuit.

14. A method, comprising:
   decoding a command to provide a decoded command;
   responsive to a clock, delaying the decoded command through a first command timing path for a first range of clock frequencies of the clock, the first command timing path providing a first delay using a first number of clock cycles of the clock, and the first delay less than a time for the first number of clock cycles; and delaying the decoded command through a second command timing path for a second range of clock frequencies of the clock, the second command timing path providing a second delay including a second number of clock cycles of the clock that is different than the first number of clock cycles.

15. The method of claim 14, further comprising delaying the decoded command through a third command timing path for a third range of clock frequencies of the clock, wherein the first, second, and third ranges of clock frequencies are different.

16. The method of claim 14 wherein the first range of clock frequencies includes higher clock frequencies than the second range of clock frequencies, and wherein the first number of clock cycles is greater than the second number of clock cycles.

17. The method of claim 14, further comprising providing the clock to the first command timing path responsive to a first frequency information and providing the clock to the second command timing path responsive to a second frequency information.

18. The method of claim 14, further comprising:

delaying the command by a delay to provide an output command at a time to meet a latency, wherein the delay includes the delay through the first or second command timing paths; and enabling a data input/output circuit responsive to the output command.

* * * * *